United States Patent
Tobita et al.

(10) Patent No.: US 6,918,983 B2
(45) Date of Patent: Jul. 19, 2005

(54) ADHESION METHOD AND ELECTRONIC COMPONENT

(75) Inventors: Masayuki Tobita, Tokyo (JP); Shinya Tateda, Tokyo (JP); Tsunehisa Kimura, Hachioji (JP); Masahumi Yamato, Chohu (JP)

(73) Assignee: Polymatech Co., Ltd., Tokyo (JP)

( * ) Notice: Subject to any disclaimer, the term of this patent is extended or adjusted under 35 U.S.C. 154(b) by 0 days.

(21) Appl. No.: 10/655,239

(22) Filed: Sep. 4, 2003

(65) Prior Publication Data

US 2004/0041257 A1 Mar. 4, 2004

Related U.S. Application Data

(62) Division of application No. 09/733,560, filed on Dec. 8, 2000, now Pat. No. 6,649,012.

(30) Foreign Application Priority Data

Sep. 5, 2002 (JP) .......................... 2002-260195

(51) Int. Cl.[7] .............................................. B32B 31/00
(52) U.S. Cl. ................ 156/272.4; 156/275.7; 257/720
(58) Field of Search ............................ 156/272.4, 275.4

(56) References Cited

FOREIGN PATENT DOCUMENTS

| JP | 8-245833 | 9/1996 |
|----|----------|--------|
| JP | 2000-92609 | 3/2000 |

Primary Examiner—Long Pham
(74) Attorney, Agent, or Firm—McGlew and Tuttle, PC

(57) ABSTRACT

The present invention provides an adhesion method of improving the heat conduction in a fixed direction by using a heat conductive adhesive made by blending boron nitride powder and adhesive polymer and adhering by orienting boron nitride powder in the heat conductive adhesive to the fixed direction under the magnetic atmosphere and an electronic component for effectively dissipating heat generated from semiconductor device 2, power source 4, light source or other components used for the electric products, and an electronic component excellent in radiation.

8 Claims, 3 Drawing Sheets

(1)

(2)

(3)

(4)

(5)

(1)

(2)

(3)

(4)

(5)

ADHESION METHOD AND ELECTRONIC COMPONENT

This is a Divisional of application Ser. No. 09/733,560 filed Dec. 8, 2000, now U.S. Pat No. 6,649,012, and the entire disclosure of this prior application is considered to be part of the disclosure of the accompanying application and is hereby incorporated by reference therein.

FIELD OF THE INVENTION

The present invention concerns an adhesion method of heat conductive adhesive requiring high heat conductivity and an electronic component. More particularly, it concerns an adhesion method of heat conductive adhesive for effectively dissipating heat generated from semiconductor device, power source, light source or other components used for the electric products, and an electronic component excellent in radiation.

BACKGROUND OF THE INVENTION

Conventionally, heat conductive adhesives having adhesive polymer as matrix have been used for bonding a heat generating semiconductor device or electronic component with a heat radiating conductive member. Silver, copper, gold, aluminum, or other metals and alloys having a good heat conductivity, or aluminum oxide, magnesium oxide, silicon oxide, boron nitride, aluminum nitride, silicon nitride, silicon carbide or other ceramics, carbon black, graphite, diamond or various other heat conductive fillers are blended in these heat conductive adhesives, in order to enhance the heat conductivity. Among others, electric insulation heat conductive adhesives filled with boron nitride powder, excellent in heat conductivity and electric insulation are used largely.

On the other hand, the Japanese Patent Laid-open No. SHO 62-194653 and the Japanese Patent Laid-open No. SHO 63-62762 disclose adhesion methods for improving the heat conductivity by orienting an adhesive including magnetic substance such as nickel in the magnetic field are disclosed.

However, the boron nitride powder has a heat conductivity in the flake shape thickness direction smaller than a heat conductivity in the surface direction; therefore, an adhesive blending simply boron nitride powder in a polymer could not present a sufficient conductivity as its surface direction is charged in parallel to the thickness direction in the adhesive layer after adhesion.

On the other hand none of adhesion methods of the aforementioned Japanese Patent Laid-open No. SHO 62-194653 or the Japanese Patent Laid open No. SHO 63-62762 could be applied to the application requiring electric insulation for blending electric conductive magnetic metal powder or the like.

In other words, as an adhesion method having a good electric insulation and high heat conductivity has not been developed, a considerable heat generation from semiconductor device or other electric components accelerated the electro-chemical migration or corrosion of wiring or pad portions, the generated heat stress provoked cracking or destruction of composing material, the interface of composing material junctions was peeled off, or other troubles happened in a way to shorten the life of electronic components.

On the other hand, the heat conductive adhesive of the Japanese Patent Laid-open No. 2000-273426 by the Applicant, has diamagnetic filler of 20 W/m·K or more in heat conductivity blended in the adhesive, but boron nitride powder was not taken into account as diamagnetic filler.

SUMMARY OF THE INVENTION

In the purpose of solving the aforementioned problems, the present invention provides an adhesion method of heat conductive adhesive for effectively dissipating heat generated from semiconductor device, power source, light source or other components used for the electric products, and an electronic component excellent in radiation.

For this effect, the present invention provides an adhesion method of improving the heat conduction in a fixed direction by using a heat conductive adhesive made by blending boron nitride powder and adhesive polymer and adhering by orienting boron nitride powder in the heat conductive adhesive to the fixed direction under the magnetic atmosphere and an electronic component.

The present invention is an adhesion method of adhering objects to be adhered by interposing a heat conductive adhesive made by blending boron nitride powder and adhesive polymer between said objects, and adhering by orienting boron nitride powder in the heat conductive adhesive to a fixed direction under the magnetic atmosphere.

Moreover, the present invention is an electronic component characterized by its structure wherein a heat conductive adhesive made by blending boron nitride powder and adhesive polymer is interposed between a heating device and a heat conductive member, and adhering by orienting boron nitride powder in the heat conductive adhesive to a fixed direction under the magnetic atmosphere.

Boron nitride powder used in the present invention is not particularly specified as for the kind of crystalline system, shape or size of powder particle, aggregation rate of powder particle, or their distribution. Concerning the crystalline system, boron nitride powder of hexagonal system, cubic system or other structures can be used. Particularly, highly crystalline boron nitride powder of hexagonal system or cubic system is preferable, because of its excellent heat conductivity.

The particle form of boron nitride powder is not limited to flake form or flat form, but also various other forms of boron nitride powder, such as granular, massive, spherical, fiber, whisker form boron nitride powder, or ground product thereof can be used. The particle diameter of boron nitride powder is not specified; however, individual average primary particle diameter in the range of 0.01~100 $\mu$m, and more preferably, in the range of 1~50 $\mu$m can be used. Under 0.01 $\mu$m, it is difficult to charge in quantity, and boron nitride powder larger than 100 $\mu$m is difficult to produce, and disadvantageous in terms of price. In addition, the adhesion layer becomes thick. As for the flake form boron nitride powder, it is practical to use within the range of 0.5~50 $\mu$m in its maximum diameter, because it can easily be blended with polymer and field oriented. Further, boron nitride powder having a structure where primary particles are aggregated is used.

The quantity of boron nitride powder to be contained in adhesive polymer is preferably 10~400 weight parts to 100 weight parts of polymer. Less than 10 weight parts, the improvement effect of heat conductivity is small, while the content more than 400 weight parts increases the composition viscosity, reduces the fluidity, making the handling difficult and bubble inclusion inevitable, so it is not appropriate. More preferably, boron nitride powder is added by 20~300 weight parts, and still preferably, by 30~200 weight parts. Higher concentrations may also be obtained by using boron nitride powders of different particle diameter, or by surface treatment.

Preferable adhesive polymers for matrix includes liquid or solid material made of epoxy base, polyimide base, acryl base, vinyl base such as polyvinyl acetate, urethane base, silicone base, olefin base, polyamide base, polyamideimide base, phenol base, amino base, bismaleimide base, polyimide silicone base, saturated and unsaturated polyester base, diallyl phthalate base, urea base, melamine base, alkyd base, benzo-cyclobutene base, polybutadiene or chloroprene rubber, nitrite rubber or other synthetic rubber base, styrene base thermoplastic elastomer or other publicly known resins or rubber.

As for hardening system, adhesive polymer of publicly known all hardening systems, such as thermosetting, thermoplastic, ultraviolet or visible light curing, room temperature setting, moisture curing, or the like can be used. Among others, at least one selected from epoxy base, polyimide base, aryl base or silicone base adhesive polymers that present good adhesion with materials composing the electronic component such as various metals and ceramics, various plastics and rubbers, elastomers, is preferable.

Besides, for the purpose of boron nitride powder surface treatment, it is possible to improve the wetness with adhesive polymer or chargeability by previously degreasing or cleaning the boron nitride powder surface, or through the surface treatment with silane base, titanium base or aluminum base or other publicly known coupling agent. It is also possible to add thixotropic agent, disperser, hardener, setting accelerator, delayer, tackifier, plasticizer, fire retardant, anti-oxidant, stabilizer, colorant or other publicly known additives to the adhesive polymer used in the present invention.

Moreover, it is also possible to use at the same time conveniently powder form metals and ceramics, to be more specific, silver, copper, gold, platinum, nickel, carbon, graphite, diamond, aluminum oxide, magnesium oxide, aluminum nitride, silicon oxide, silicon carbide, or the like, or fillers used for conventional heat conductive adhesives such as metal coating resin. However, as the excellent electric insulation is one of characteristics of the heat conductive adhesive used for the present invention, it is preferable, as far as possible, not to mix fillers of good electric conductivity such as metals.

Moreover, in order to reduce the adhesive viscosity, it is effective to add volatile organic solvent or reactive plasticizer as they increase the workability.

The adhesion method of the present invention is an adhesion method of adhering objects to be adhered by interposing a heat conductive adhesive made by blending boron nitride powder and adhesive polymer between said objects, and adhering by orienting boron nitride powder in the heat conductive adhesive to a fixed direction under the magnetic atmosphere.

It is possible to improve the adhesive heat conductivity taking profit of the high heat conductivity of oriented boron nitride powder, by orienting boron nitride powder in the adhesive along the magnetic line, under the magnetic atmosphere. In order to align flake or other form boron nitride powder in the gap direction of objects to be adhered, namely, in the adhesive thickness direction, N pole and S pole of permanent magnet or electromagnet are opposed in the thickness direction, and disposed so that the magnetic line corresponds to the desired orientation direction of boron nitride powder.

On the other hand, in order to enhance the heat conductivity in the adhesive plane inside direction, boron nitride powder can be oriented aligned in the plane inside direction by opposing the magnet N pole and S pole vertically to the thickness direction. Otherwise, boron nitride powder can also be aligned in the plane inside direction by opposing the magnet N pole and N pole, or S pole and S pole in the thickness direction. Besides, magnets need not to be opposed at both sides, but magnets disposed only on one side may also orient boron nitride powder in the adhesive.

Magnetic field generation means used as exterior magnetic field may be a permanent magnet, electromagnet or coil, and a flux density range from 0.05 to 30 tesla can achieve a practical orientation of boron nitride powder. As the present invention used a very weak diamagnetic an-isotropic magnetic susceptibility of boron nitride powder as magnetism, it is necessary to orient boron nitride powder sufficiently in a high magnetic field of 1 tesla or more, and to set matrix adhesive polymer by thermosetting reaction or cooling.

The heat conductive adhesive used in the present invention can be produced by blending and evenly dispersing a predetermined amount of boron nitride powder in the adhesive polymer. For the dispersion by mixing or kneading, it is preferable to add a publicly known process for removing mixed bubbles by depression or pressurization.

Electronic component of the present invention as shown in FIG. 1 to FIG. 4 can be manufactured by interposing a heat conductive adhesive made of boron nitride powder and adhesive polymer between a heating device and a heat conductive member, and adhering with boron nitride powder oriented in the heat conductive adhesive to a fixed direction under the magnetic atmosphere.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
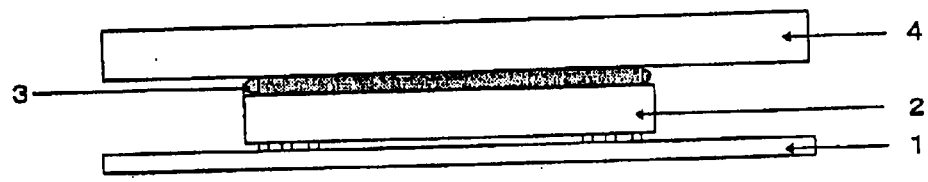
FIG. 1 to FIG. 4 are examples of electronic component made by the adhesion method of the present invention.
Figure 2:
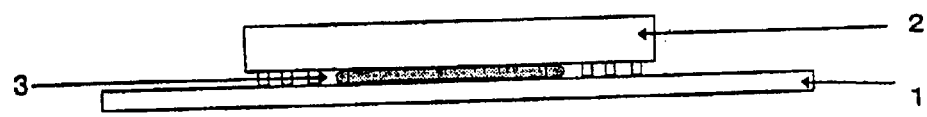
Figure 3:
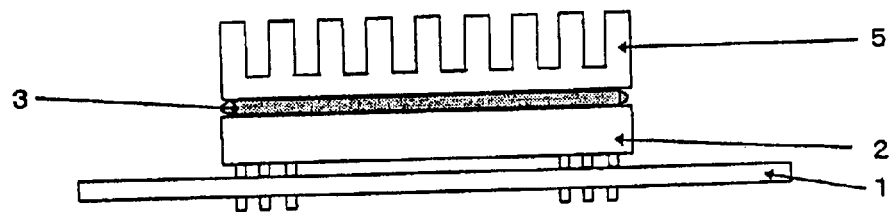
Figure 4:
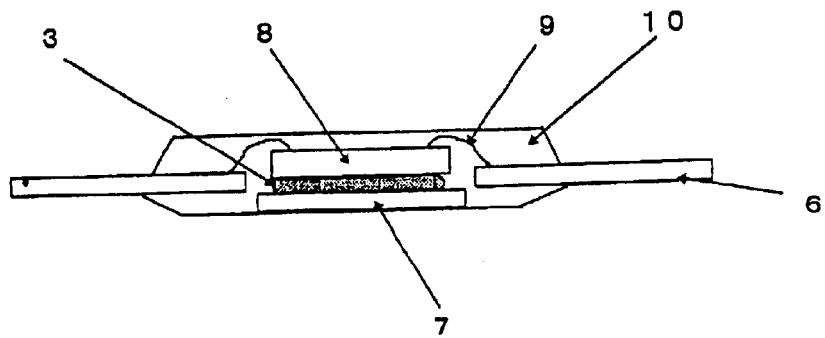

Referring to the drawings in particular, FIG. 1 shows the use of the adhesive 3 for the adhesion between a ball grid array type semiconductor package 2 and a radiator 4. FIG. 2 shows the use of the adhesive 3 for the adhesion between a chip size type semiconductor package 2 and a printed circuit board 1; FIG. 3 shows the use of the adhesive 3 for the adhesion between a pin grid array type semiconductor package 2 and a heat sink 5; and FIG. 4 shows the use of the adhesive 3 for the adhesion between a semiconductor chip 8 and a die pad 7.

Heat conductive adhesive can be interposed between object to be adhered by screen printing, pad printing, dispenser application, potting, spray coating or other publicly known methods. Heating devices include semiconductors, electric power source or light source, and heat conductive members include ordinary radiator, cooler, heat sink, heat spreader, die pad, printed circuit board (PCB), cooling fan, heat pipe or casing.

Now, the present invention will be described more in detail based on examples. In the following examples and comparison examples, the heat conductivity was evaluated through the measurement of heat resistance value.

EXAMPLE 1

A heat conductive adhesive A is prepare by blending 40 weight parts of hexagonal crystalline system flake form boron nitride powder (made by Showa Denko K. K. UHP-S1 average particle diameter 1 to 2 µm) treated with aminosilane base coupling agent and 100 weight parts of bisphenol F type epoxy resin containing amine base hardener as adhesive polymer, and degassing in the vacuum.

Figure 5:
FIG. 5, FIG. 6 are schematic views of the adhesion method and electronic component of the present invention.
Figure 5:
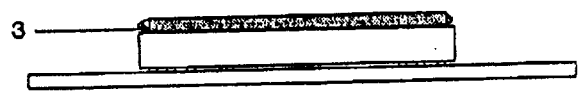
Figure 5:
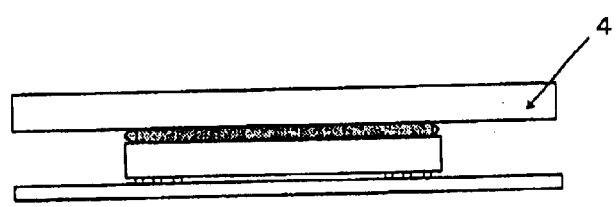
Figure 5:
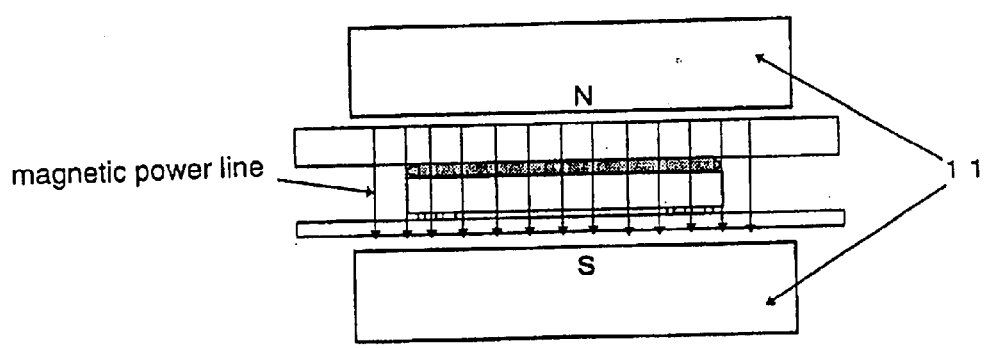
Figure 5:
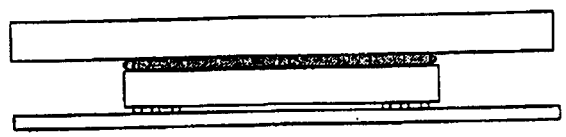

The heat conductive adhesive A (3) is applied with a dispenser to a ball grid array type semiconductor package 2 implemented on a PCB 1 describe in FIG. 5(1) (FIG. 5(2)). A radiator 4 is disposed and pressed on the upper portion of the heat conductive adhesive A as shown in FIG. 5(3), and an electronic component (FIG. 5(5)) is prepared by heat setting the heat conductive adhesive A in a magnetic field atmosphere where N pole and S pole of an permanent magnet 11 of flux density 0.6 tesla are opposed as shown in FIG. 5(4).

The apparatus is turned on to measure the heat resistance after 6 minutes, obtaining 0.48° C./W.

Comparison 1

The heat conductive adhesive A (3) similar to the Example 1 is applied with a dispenser to a ball grid array type semiconductor package 2 implemented on a PCB 1 describe in FIG. 5(1) (FIG. 5(2)). A radiator 4 is disposed and pressed on the upper portion of the heat conductive adhesive A as shown in FIG. 5(3), and an electronic component (FIG. 5(5)) is prepared by heat setting the heat conductive adhesive A without impressing the magnetic field.

The apparatus is turned on to measure the heat resistance after 6 minutes, obtaining 0.61° C./W.

EXAMPLE 2

A heat conductive adhesive B (3) is prepare by blending 80 weight parts of hexagonal crystalline system flake form boron nitride powder (made by Showa Denko K. K. UHP-S1 average particle diameter 1 to 2 µm) and 100 weight parts of added type liquid silicones rubber (made by GE Toshiba Silicon, TSE3331) as adhesive polymer, and degassing in the vacuum.

The heat conductive adhesive B is applied with a dispenser to a ball grid array type semiconductor package 2 implemented on a PCB 1 describe in FIG. 5(1) (FIG. 5(2)) as in the Example 1. A radiator 1 is disposed and pressed on the upper portion of the heat conductive adhesive B as shown in FIG. 5(3), and an electronic component (FIG. 5(5)) is prepared by heat setting the heat conductive adhesive B in a magnetic field atmosphere where N pole and S pole of an electromagnetic magnet 11 of flux density 2 tesla are opposed as shown in FIG. 5(4).

The apparatus is turned on to measure the heat resistance after 6 minutes, obtaining 0.37° C./W.

Comparison 2

The heat conductive adhesive B (3) similar to the Example 2 is applied with a dispenser to a ball grid array type semiconductor package 2 implemented on a PCB 1 describe in FIG. 5(1) (FIG. 5(2)). A radiator 1 is disposed and pressed on the upper portion of the heat conductive adhesive B as shown in FIG. 5(3), and an electronic component (FIG. 5(5)) is prepared by heat setting the heat conductive adhesive B without impressing the magnetic field.

The apparatus is turned on to measure the heat resistance after 6 minutes, obtaining 0.48° C./W.

EXAMPLE 3

A heat conductive adhesive C is prepare by blending 120 weight parts of hexagonal crystalline system fine particle form boron nitride powder (made by Denki Kagaku Kogyo K. K. SP-1 average particle diameter 0.6 µm) and 100 weight parts of thermo-setting polyimide (made by UBE INDUSTRIES, LTD. Yupitite UPA-83), and degassing in the vacuum.

Figure 6:
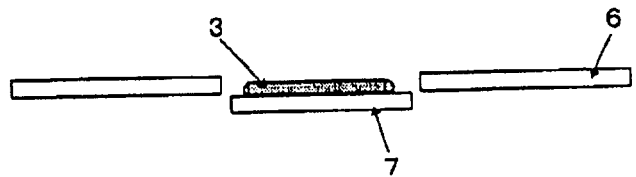
Figure 6:
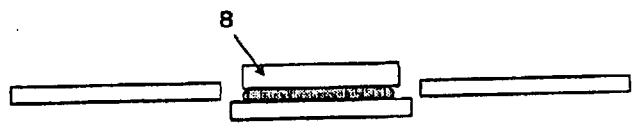
Figure 6:
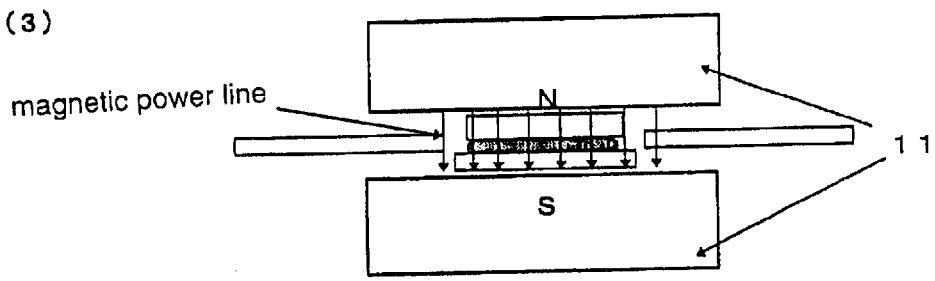
Figure 6:
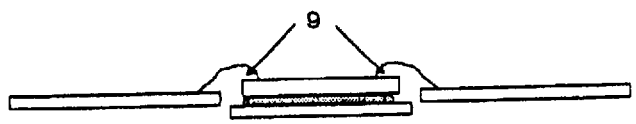
Figure 6:
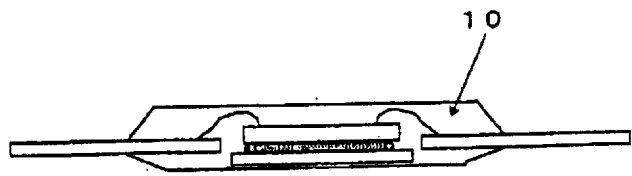

The heat conductive adhesive C (3) is screen printed on a die pad 7 of a lead frame 6 describe in FIG. 6(1) (FIG. 6(2)). A semiconductor chip 8 is disposed and pressed on the upper portion of the heat conductive adhesive C as shown in FIG. 6(2), and the heat conductive adhesive C is heat set in a magnetic field atmosphere where N pole and S pole of an electromagnetic magnet 11 of flux density 2 tesla are opposed as shown in FIG. 6(3). An electronic component (FIG. 6(5)) is manufactured by connecting an electrode portion of the semiconductor chip 8 and a lead portion of the lead frame by a bonding wire 9 (FIG. 6(4)) and by transfer molding with epoxy base sealant 10.

The apparatus is turned on to measure the heat resistance after 6 minutes, obtaining 0.28° C./W.

Comparison 3

The heat conductive adhesive C (3) similar to Example 3 is screen printed on a die pad 7 of a lead frame 6 describe in FIG. 6(1) (FIG. 6(1)). A semiconductor chip 8 is disposed and pressed on the upper portion of the heat conductive adhesive C as shown in FIG. 6(2), and the heat conductive adhesive C is heat set without impressing the magnetic field. An electronic component (FIG. 6(5)) is manufactured by connecting the electrode portion of the semiconductor chip 8 and the lead portion of the lead frame 11 by a bonding wire 9 (FIG. 6(4)) and by transfer molding with epoxy base sealant 10.

The apparatus is turned on to measure the heat resistance after 6 minutes, obtaining 0.40° C./W.

Compared to Comparison 1~Comparison 3, the electronic components made by the adhesion methods of Example 1~Example 3 of the present invention are low in heat resistance value and excellent in heat conductivity because boron nitride powder is oriented by magnetic field in the heat conductive adhesive. Therefore, the adhesion method of the present invention can be applied largely to the adhesion of a semiconductor package of high heating value and a radiator such as heat sink, or adhesion of a semiconductor chip of high heating value and a die pad portion, and supply a useful electronic component that is low in heat resistance and excellent in heat conductivity.

While specific embodiments of the invention have been shown and described in detail to illustrate the application of the principles of the invention, it will be understood that the invention may be embodied otherwise without departing from such principles.

What is claimed is:

1. An electronic component characterized by its structure wherein a heat conductive adhesive made by blending boron nitride powder that has a diamagnetic an-isotropic magnetic susceptibility and adhesive polymer ii interposed between a beating device and a heat conductive member, and adhering with boron nitride powder oriented in the heat conductive adhesive to a fixed direction under a magnetic field atmosphere by the use of the diamagnetic an-isotropic magnetic susceptibility of the boron nitride powder.

2. An electronic component according to claim 1, wherein the boron nitride powder is a boron nitride powder of hexagonal system or cubic system.

3. An electronic component according to claim 1, wherein the boron nitride powder is aligned in the gap direction of objects to be adhered, namely, in the adhesive thickness direction.

4. An electronic component, comprising:

a heat generating part;

a heat conductive part; and a heat conductive adhesive made by blending boron nitride powder that has a diamagnetic an-isotropic magnetic susceptibility and an adhesive polymer, said heat conductive adhesive being interposed between said heat generating part and said heat conductive part and being adhered to each of said heat generating part and said heat conductive part, said boron nitride powder being oriented in a fixed direction in said heat conductive adhesive with said fixed direction being attained by subjecting said heat conductive adhesive to a magnetic field prior to setting or during setting of the adhesive with the fixed direction being due to the diamagnetic au-isotropic magnetic susceptibility of the boron nitride powder.

5. An electronic component according to claim 4, wherein the boron nitride powder is a boron nitride powder of hexagonal system or cubic system.

6. An electronic component according to claim 4, wherein a distance between said heat generating part and said beat conductive part defines adhesive thickness and the boron nitride powder is aligned in a direction of said adhesive thickness.

7. An electronic component, comprising:

a heal generating part;

a heat conductive part; and a heat conductive adhesive made by blending boron nitride powder that has a diamagnetic an-isotropic magnetic susceptibility and an adhesive polymer, said heat conductive adhesive being interposed between a surface of said heat generating part and a surface of said heat conductive part and being adhered to each of said heat generating part and said heat conductive part, said boron nitride powder including boron nitride with a flake shape having a small thickness and a large length, said boron nitride powder being oriented in a fixed direction in said heat conductive adhesive including boron nitride with a flake shape having the length substantially perpendicular to each of said surface of said heat generating part and said surface of said heat conductive part with said fixed direction being attained by subjecting said heat conductive adhesive to a magnetic field prior to setting or during setting of said adhesive with the fixed direction being due to the diamagnetic an-isotropic magnetic susceptibility of the boron nitride powder.

8. An electronic component according to claim 7, wherein the boron nitride powder is a boron nitride powder of hexagonal system or cubic system.

* * * * *